(12) United States Patent
Thenus et al.

(10) Patent No.: US 9,711,108 B2
(45) Date of Patent: Jul. 18, 2017

(54) LOW POWER HIGH FREQUENCY DIGITAL PULSE FREQUENCY MODULATOR

(71) Applicants: Fenardi Thenus, Portland, OR (US); Peng Zou, Portland, OR (US); Raghu Nandan Chepuri, Bangalore (IN); Henry K. Koertzen, Olympia, WA (US)

(72) Inventors: Fenardi Thenus, Portland, OR (US); Peng Zou, Portland, OR (US); Raghu Nandan Chepuri, Bangalore (IN); Henry K. Koertzen, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/129,269

(22) PCT Filed: Jun. 10, 2013

(86) PCT No.: PCT/US2013/045006
§ 371 (c)(1),
(2) Date: Dec. 24, 2013

(87) PCT Pub. No.: WO2014/200461
PCT Pub. Date: Dec. 18, 2014

(65) Prior Publication Data
US 2016/0111061 A1    Apr. 21, 2016

(51) Int. Cl.
*G09G 5/00* (2006.01)
*H02M 3/158* (2006.01)
(Continued)

(52) U.S. Cl.
CPC .......... *G09G 5/006* (2013.01); *G06F 3/0412* (2013.01); *H02M 3/158* (2013.01);
(Continued)

(58) Field of Classification Search
CPC ........ G09G 5/006; G06F 3/0412; H03K 5/14; H03K 5/133
See application file for complete search history.

(56) References Cited

U.S. PATENT DOCUMENTS 4,109,209 A * 8/1978 Bismarck ................. H03K 5/26
                                                         327/2
7,378,893 B1 * 5/2008 Kang ..................... H03K 5/131
                                                       327/175
(Continued)

OTHER PUBLICATIONS

Notification of Transmittal of the International Search Report and the Written Opinion of the International Searching Authority issued for PCT International Patent Application No. PCT/US2013/045006, mailed Dec. 23, 2015, 12 pages
(Continued)

*Primary Examiner* — Kevin M Nguyen
(74) *Attorney, Agent, or Firm* — Blakely, Sokoloff, Taylor & Zafman LLP

(57) ABSTRACT

Described is an apparatus that comprises: a programmable delay line (PDL) to receive a pulse-width modulation (PWM) signal as input and to generate a first output; a selection unit operable to provide PWM signal or its inverted version as a second output; and a sequential unit coupled to the PDL, the sequential unit to sample the second output with the first output, the sequential unit to generate a pulse-frequency modulation (PFM) output. Described is also a voltage regulator which comprises: mutually coupled on-die inductors for coupling to a load; a bridge, coupled to the mutually coupled on-die inductors, including a low-side switch and a high-side switch; a PWM controller for controlling the low-side and high-side switches during a first load current; and a PFM controller for controlling the low-side and high-side switches during a second load current, the second load current being smaller than the first load
(Continued)

current, the PFM controller comprising: a comparator for comparing output voltage of the load with a reference voltage; and a first PDL coupled to the comparator for determining turn-on duration of the high-side switch.

7 Claims, 8 Drawing Sheets

(51) Int. Cl.

| | | |
|---|---|---|
| G06F 3/041 | (2006.01) | |
| H03K 5/14 | (2014.01) | |
| H03K 7/06 | (2006.01) | |
| H03K 7/08 | (2006.01) | |
| H03K 17/284 | (2006.01) | |
| H02M 1/00 | (2006.01) | |

(52) U.S. Cl.
CPC ............ *H02M 3/1584* (2013.01); *H03K 5/14* (2013.01); *H03K 7/06* (2013.01); *H03K 7/08* (2013.01); *H03K 17/284* (2013.01); *G09G 2330/021* (2013.01); *H02M 2001/0009* (2013.01); *H02M 2001/0032* (2013.01); *H02M 2003/1586* (2013.01); *Y02B 70/16* (2013.01)

(56) References Cited

U.S. PATENT DOCUMENTS

| | | | |
|---|---|---|---|
| 2004/0130365 A1* | 7/2004 | Han | ....................... H03K 5/133 327/158 |
| 2008/0309392 A1 | 12/2008 | Warren | |
| 2011/0062926 A1 | 3/2011 | Qiu et al. | |
| 2012/0223691 A1 | 9/2012 | Weinstein et al. | |

OTHER PUBLICATIONS

Notification of Transmittal of the International Search Report and the Written Opinion of the International Searching Authority issued for PCT International Patent Application No. PCT/US2013/045006, mailed Mar. 20, 2014, 7 pages.

* cited by examiner

LOW POWER HIGH FREQUENCY DIGITAL PULSE FREQUENCY MODULATOR

CLAIM OF PRIORITY

This application claims the benefit of priority of International Patent Application No. PCT/US2013/045006 filed Jun. 10, 2013, titled "LOW POWER HIGH FREQUENCY DIGITAL PULSE FREQUENCY MODULATOR," which is incorporated by reference in its entirety.

BACKGROUND

Pulse-Width-Modulation (PWM) mode, compared to Pulse-Frequency-Modulation (PFM) mode, has poor conversion efficiency at low loads due to the constant switching frequency. At low loads (i.e., loads consuming less current), voltage regulators (VRs) may use PFM mode instead of PWM mode. Typically, VRs operating in PWM mode operate at low frequencies e.g., 1 MHz. Low frequency operation is possible because of off-die inductors which are large in size. Such large inductors are not suitable for use in today's mobile devices (e.g., smart devices, tablets, smart phones, etc.) which have small form factor compared to desktop computers, for example.

However, when inductors are placed on-die (e.g., in microprocessors) for voltage regulation, inductor size is reduced because increasing die size to accommodate a large inductor size increases manufacturing costs of the die. A VR with smaller sized inductor can operate with comparable efficiency as a VR with large sized inductor by increasing switching frequency of the VR using smaller sized inductor. For example, switching frequency can be increased to 100 MHz (instead of typical low frequency of 1 MHz). However, by increasing switching frequency (e.g., from 1 MHz to 100 MHz) to improve VR efficiency, power consumption increases.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
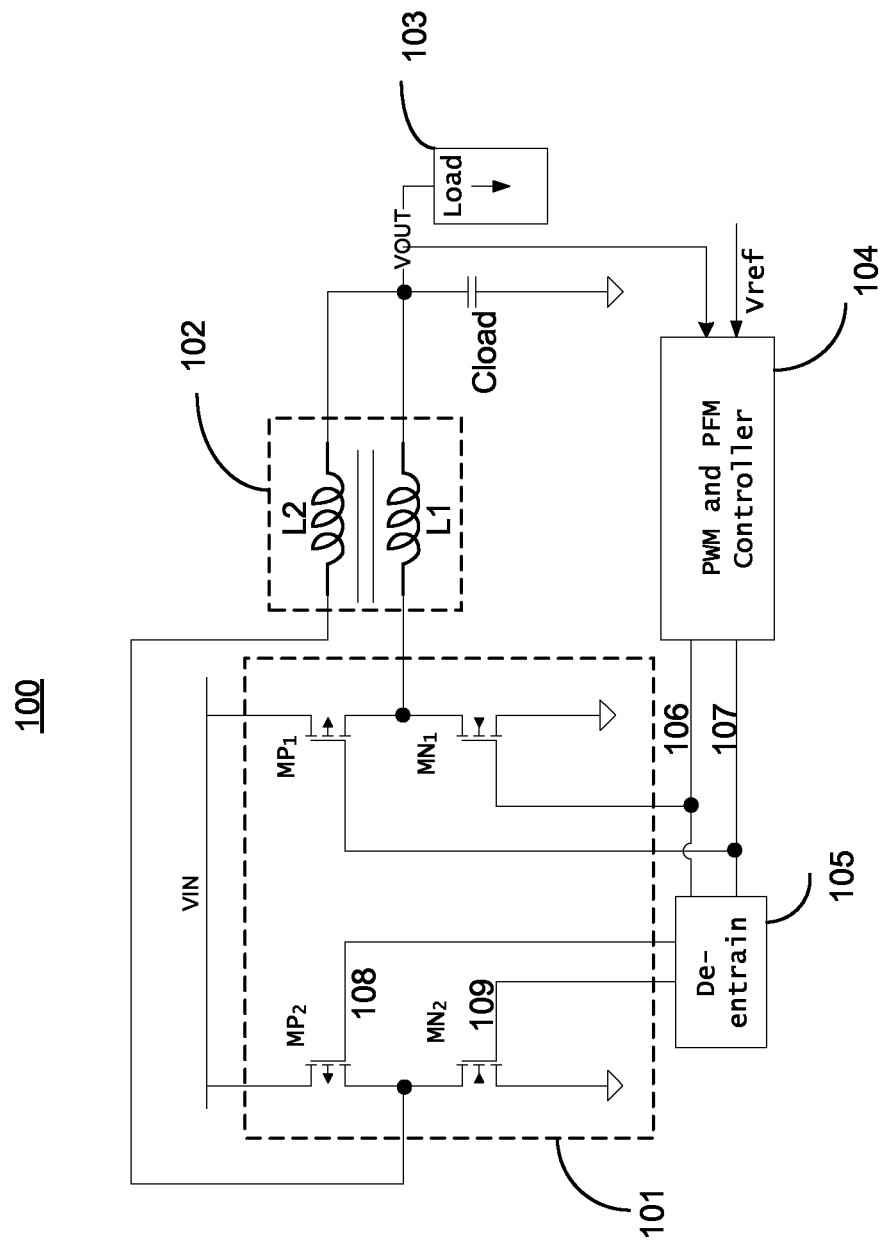
FIG. 1 is a voltage regulator (VR) with a low power controller for performing Pulse-Width-Modulation (PWM) and Pulse-Frequency-Modulation (PFM), according to one embodiment of the disclosure.

The embodiments describe a VR (voltage regulator) with a controller having wide bandwidth to accommodate switching frequencies in the range of 10 s of KHz to 100 s of MHz to provide high VR efficiency over changing load current conditions. As discussed in the background section, conventional VRs use discrete inductors that rarely have VR switching frequency beyond 5 MHz. If conventional VRs are forced to operate at 100 s of MHz of switching frequency, their power consumption becomes prohibitive for use in low power mobile computing devices (e.g., laptops, tablets, smart devices, phones, etc.). Embodiments describe a controller which is operable to support PWM (pulse-width modulation) and PFM (pulse-frequency modulation) modes such that the PFM mode consumes low power (e.g., 90 µW).

A bridge of a VR comprises a high-side switch and a low-side switch to drive the inductor and load capacitor coupled to a load. When the high-side switch is turned on, the inductor current starts to linearly ramp up from zero. After the current reaches a desired peak value, the high-side switch is turned off and the low-side switch is turned on. When the low-side switch turns on, the inductor current starts to linearly decrease. However, in traditional VRs, the low-side switch may not be turned off when the current reaches zero. As a result, voltage spikes on output node (coupled to the load capacitor) are observed and the VR experiences reduced efficiency. Conventionally, a high gain zero current or negative current sensing circuit is utilized to trigger the switching off operation of the low-side switch. However, such an analog circuit may consume several mW (milliwatts) of power. The embodiments describe a low power digital current sensor. In one embodiment, the low power digital current sensor replaces the conventional analog current sensor such that the digital current sensor consumes over 100 times less power than a comparable analog current sensor.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and the include plural references. The meaning of "in" includes "in" and "on."

The term "scaling" generally refers to converting a design (schematic and layout) from one process technology to another process technology. The term "scaling" generally also refers to downsizing layout and devices within the same technology node. The terms "substantially," "close," "approximately," "near," "about," etc., generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 is a VR 100 with a low power controller for performing PWM and PFM modes, according to one embodiment of the disclosure. In one embodiment, VR 100 comprises bridge 101, inductor unit 102, load capacitor Cload, load 103, low power PWM and PFM controller 104, and De-entrain unit 105.

In one embodiment, bridge 101 comprises a high-side switch and a low-side switch. In this embodiment, high-side switch includes p-type devices $MP_1$ and $MP_2$ while low-side switch includes n-type devices $MN_1$ and $MN_2$. In one embodiment, $MP_1$ and $MN_1$ drive a first inductor L1 of inductor unit 102. In one embodiment, $MP_2$ and $MN_2$ drive a second inductor L2 of inductor unit 102. In one embodiment, first and second inductors (L1 and L2) are mutually coupled inductors that drive load capacitor Cload coupled to load 103.

In one embodiment, load 103 is a processor core of a multi-core processor. In one embodiment, load 103 is cache memory unit of the multi-core processor. In other embodiments, load 103 is any logic unit that requires a regulated voltage for performing its functions.

In one embodiment, low power PWM and PFM controller 104 compares output voltage Vout (also called a feedback voltage, Vfb) with a reference voltage Vref to determine the ON and OFF times (i.e., switching patterns) for high-side and low-side switches. In one embodiment, when the the load current is high, as determined by a digital current sensor, low power PWM and PFM controller 104 operates in PWM mode. In one embodiment, when the load current is low, as determined by the digital current sensor, low power PWM and PFM controller 104 operates in PFM mode. In one embodiment, based on VR efficiency curve (not shown), low load current setpoint is determined which indicates when controller 104 should switch over from PWM mode to PFM mode. For example, when load current is less than 600 mA, VR 100 may exhibit higher efficiency if it operates in PFM mode instead of PWM mode.

In one embodiment, low power PWM and PFM controller 104 implements a method and circuit for an accurate, sensor-less and low power controller to set the ON-time of the upper (MP i.e., high-side) and lower (MN, i.e., low-side) switches. In one embodiment, a programmable digital delay line (PDL) is used to control the ON-time of the upper (MP) and lower (MN) switches as discussed with reference to FIG. 4.

Referring back to FIG. 1, in one embodiment, the ON-time setting for the high-side and low-side switches is measured prior to switching the VR controller 104 from PWM mode to PFM mode. In such an embodiment, dynamic sensing circuit (such as negative current sensing) which may require high bandwidth and power is not used. In one embodiment, a low power digital current sensor is used as discussed with reference to FIGS. 7A-B to determine when to switch from PWM mode to PFM mode. In one embodiment, the dynamic sensing circuit is part of controller 104. In other embodiments, dynamic sensing circuit is coupled to controller 104.

In one embodiment, delay of PDL scales with PWM pulse width, where the logical high state of PWM pulse corresponds to ON-time of high-side switch $MP_1$ and logical low state corresponds to ON-time of low-side switch $MN_1$. In one embodiment, ON-time for the high-side and low-side switches is programmable so that peak inductor current can be controlled. In such an embodiment, PFM controller (part of 104) consumes low power (e.g., consumes 60 uA at 1 mA load current, and scales up almost linearly as load current increases.). In one embodiment, output 107 of low power PWM and PFM controller 104 controls the gate of high-side switch $MP_1$. In one embodiment, output 106 of low power PWM and PFM controller 104 controls the gate of low-side switch $MN_1$.

In one embodiment, De-entrain logic 105 generates control signals for another set of high-side and low-side switches. For example, De-entrain logic 105 receives signals 106 and 107 and generates signal 108 for controlling high-side switch $MP_2$ and generates signal 109 for controlling low-side switch $MN_2$. In one embodiment, De-entrain logic 105 limits voltage spikes generated by high di/dt current profile during switching of bridge switches by introducing phase shift to control signals 106 and 107. In such an embodiment, high-side switch $MP_2$ sources current to second inductor L2 at a different phase than when high-side switch $MP_1$ sources current to first inductor L1. In one embodiment, low-side switch $MN_2$ sinks current from second inductor L2 at a different phase than when low-side switch $MN_1$ sinks current from first inductor L1. In one embodiment, De-entrain logic 105 is a buffer with either fixed or adjustable propagation delay. In one embodiment, the buffer is a chain of inverters. In other embodiments, other buffer circuit designs may be used.

Figure 2:
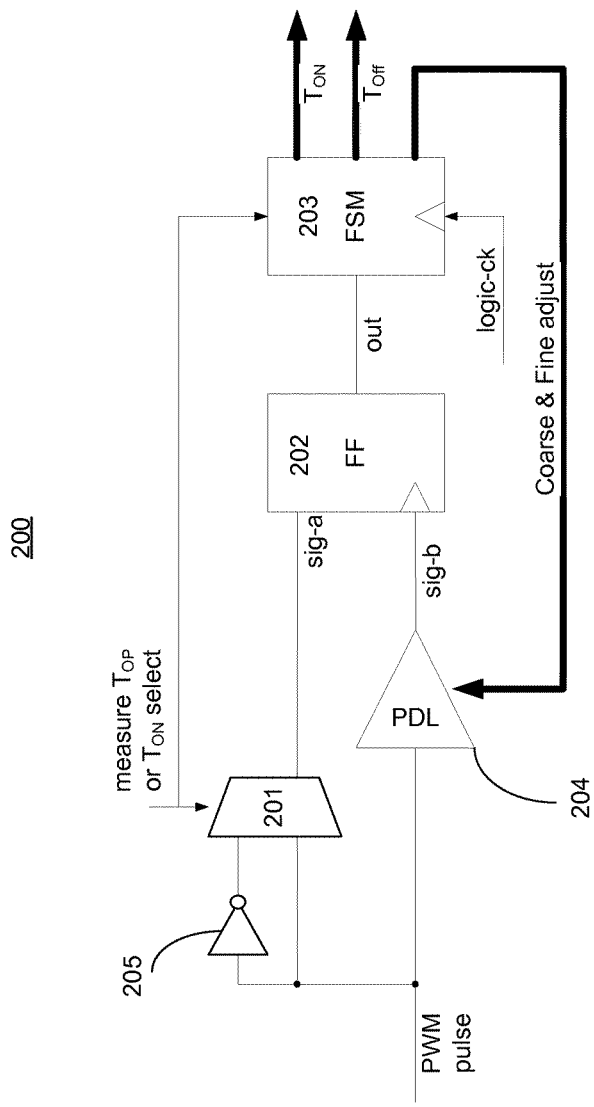
FIG. 2 is a PWM pulse width recorder, according to one embodiment of the disclosure.

FIG. 2 is a PWM pulse width recorder 200 (also called pulse generator circuit), according to one embodiment of the disclosure. It is pointed out that those elements of FIG. 2 having the same reference numbers (or names) as the elements of any other figure can operate or function in any manner similar to that described, but are not limited to such.

In one embodiment, PWM pulse width recorder 200 comprises a selection unit 201 (e.g., a 2:1 multiplexer), a sequential unit 202 (e.g., edge triggered master-slave flip-flop (FF)), a finite state machine (FSM) 203, and PDL 204. In this embodiment, PWM pulse width recorder 200 determines the ON times and OFF times for high-side and low-side switches (e.g., $MP_1$ and $MN_1$) of bridge 101 according to the high and low pulse widths generated by the PWM modulator (not shown). In one embodiment, PFM pulse duration is generated according to the PWM duty cycle.

In one embodiment, pulse generator circuit 200 is disabled during PFM mode to save power. PFM mode is enabled during low load current consumption. In one embodiment, during PWM mode, the pulse duty cycle is set by controller 104 according to the following equation: D=V(output)/V(input) for buck converter, where 'D' is the duty cycle and is related to switching frequency by D=Top/Tsw and $T_{SW}=T_{ON}+T_{OP}$, where $T_{SW}$ is the period of the switching frequency, and where $T_{OP}$ and $T_{ON}$ is the ON-times of $MP_1$ (i.e., high-side switch) and the $MN_1$ (i.e., low-side switch), respectively.

In one embodiment, both $T_{OP}$ and $T_{ON}$ information are measured during PWM mode (i.e., when controller 104 is operating in PWM mode) by pulse generator circuit 200 with its timing illustrated with reference to FIGS. 3A-B. Referring back to FIG. 2, PDL 204 is a programmable delay circuit having propagation delay which is adjusted to be proportional to PWM pulse width duration, according to one embodiment. In one embodiment, initially the 2:1 multiplexer (selection unit 201) selects a non-inverted PWM pulse and PDL 204 is set to minimum delay. In this embodiment, PDL output (sig-b) is used as a clock signal for FF 202 to sample a non-delayed PWM pulse (sig-a). In one embodiment, if the output "out" of FF 202 is logical high, then FSM 203 increases the delay time of PDL 204. This process continues until "out" becomes logical low. In one embodiment, delay of PDL 204 is adjusted by coarse and/or fine delay settings which are discussed with reference to FIG. 4.

Referring back to FIG. 2, when "out" becomes logical low, FSM 203 refers back to the previous delay count and starts fine tuning the adjustment until FF 202 output "out" turns logical low again. This ends the measurement of $T_{OP}$. FSM 203 operates using clock signal "logic_ck." In one embodiment, "logic_ck" clock signal is derived from system logic clock signal. In one embodiment, "logic_ck" clock signal is independent of VR clock signal. In one embodiment, the final count is recorded in a Top register (not shown). In one embodiment, the $T_{ON}$ measurement procedure is similar to the Top measurement procedure except selection unit 201 selects the inverted PWM pulse (generated by inverter 205) and the FF 202 output "out" is at a high state at the final count. The term "final count" generally refers to a last count before "out" signal flips from logical low state to logical high state.

Figure 3B:
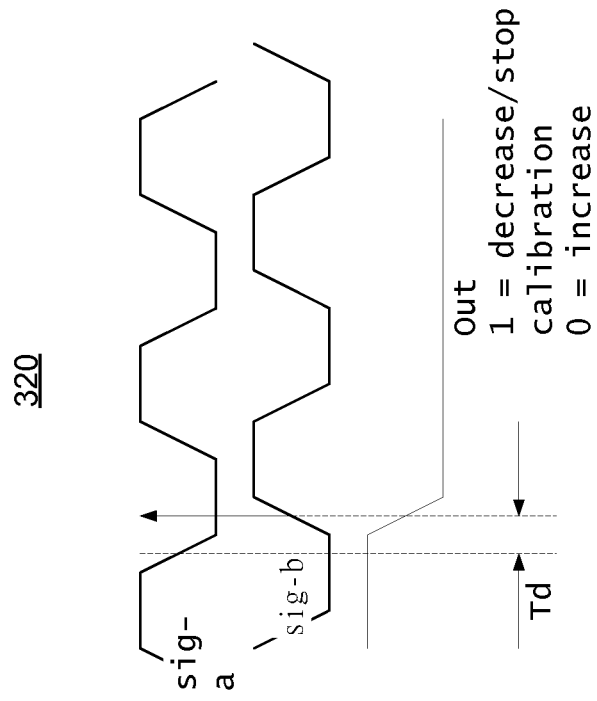
FIGS. 3A-B illustrate operation of the PWM pulse width recorder, according to one embodiment of the disclosure.
Figure 3A:
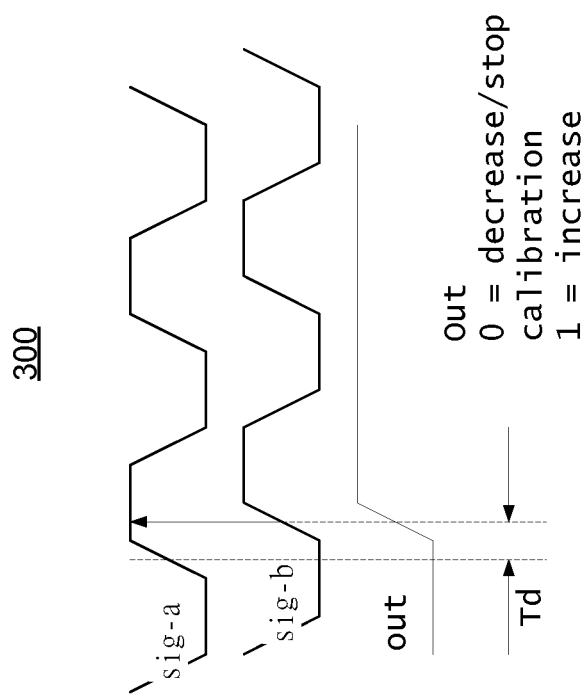

FIGS. 3A-B are plots with waveforms that illustrate operation of PWM pulse width recorder 200, according to one embodiment of the disclosure. It is pointed out that those elements of FIGS. 3A-B having the same reference numbers (or names) as the elements of any other figure can operate or function in any manner similar to that described, but are not limited to such.

FIG. 3A illustrates waveforms 300. In this example, signal "sig-b" is used as a clock signal by FF 202 to sample "sig-a," which is a non-inverted version of PWM pulse. When signal "out" is logical high, then FSM 203 increases the delay time of PDL 204. This process continues until "out" becomes logical low. When "out" is logical low, FSM 203 either stops the adjustment of delay by PDL 204 or decreases the delay generated by PDL 204.

FIG. 3B illustrates waveforms 320. In this example, signal "sig-b" is used as a clock signal by FF 202 to sample "sig-a," which is an inverted version of PWM pulse. When signal "out" is logical low, then FSM 203 increases the delay time of PDL 204. This process continues until "out" becomes logical high. When "out" is logical high, FSM 203 either the stops adjustment of delay by PDL 204 or decreases the delay generated by PDL.

Figure 4:
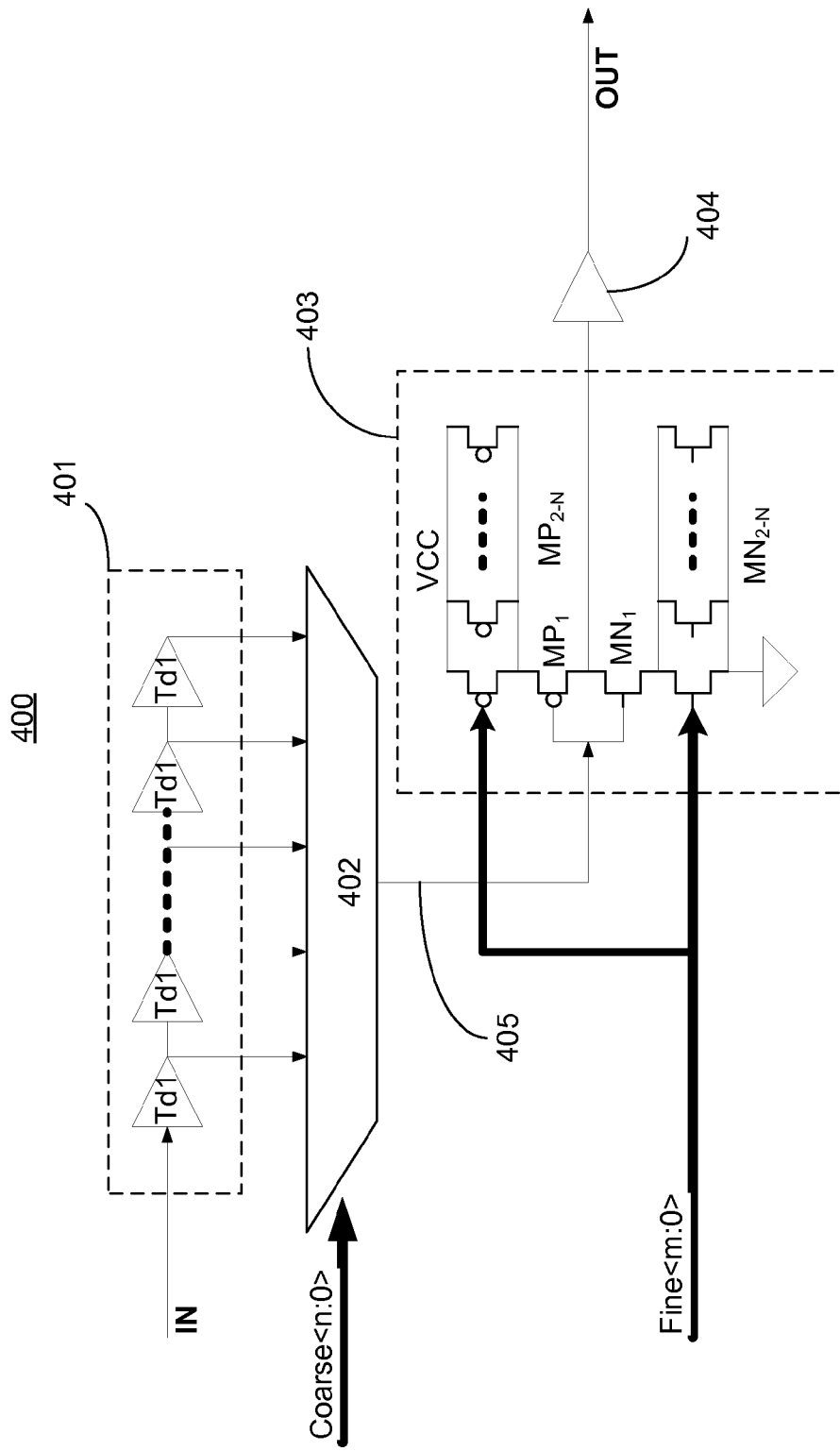
FIG. 4 is a programmable delay line (PDL) used in the PWM pulse width recorder and the low power controller, according to one embodiment of the disclosure.

FIG. 4 is a PDL 400 used in PWM pulse width recorder 200 and low power controller 104, according to one embodiment of the disclosure. It is pointed out that those elements of FIG. 4 having the same reference numbers (or names) as the elements of any other figure can operate or function in any manner similar to that described, but are not limited to such.

In one embodiment, PDL 400 comprises: a delay line 401 with a plurality of delay cells, each with delay Td1; selection unit 402, fine delay adjustment unit 403, and buffer 404. In one embodiment, output of each delay cell of the plurality of delay cells is received as input by selection unit 402. In one embodiment, selection unit 402 is a multiplexer controllable by signal Coarse<n:0>, where 'n' is an integer greater than 1. For example, n=31 for a 32 bit Coarse bus. In one embodiment, Coarse<n:0> is generated by FSM 203. In one embodiment, output 405 of selection unit 402 is the coarse delay adjusted signal representation of input signal "IN." In one embodiment, output 405 is further delayed by fine delay adjustment unit 403.

In one embodiment, fine delay adjustment unit 403 comprises a current starved inverter with an inverting unit formed from $MP_1$ and $MN_1$ and delay adjustment devices $MP_{2-N}$ and $MN_{2-N}$, where 'N' is an integer greater than 1. In one embodiment, turning on and off devices $MP_{2-N}$ and $MN_{2-N}$ adjusts the delay of signal "OUT." In one embodiment, devices $MP_{2-N}$ and $MN_{2-N}$ are binary weighted. In another embodiment, devices $MP_{2-N}$ and $MN_{2-N}$ are thermometer weighted. In one embodiment, devices $MP_{2-N}$ and $MN_{2-N}$ are controlled by signal bus Fine<m:0>, where 'm' is an integer. For example, m=15 for a 16 bit Fine bus. In one embodiment, Fine<m:0> is generated by FSM 203.

Figure 5:
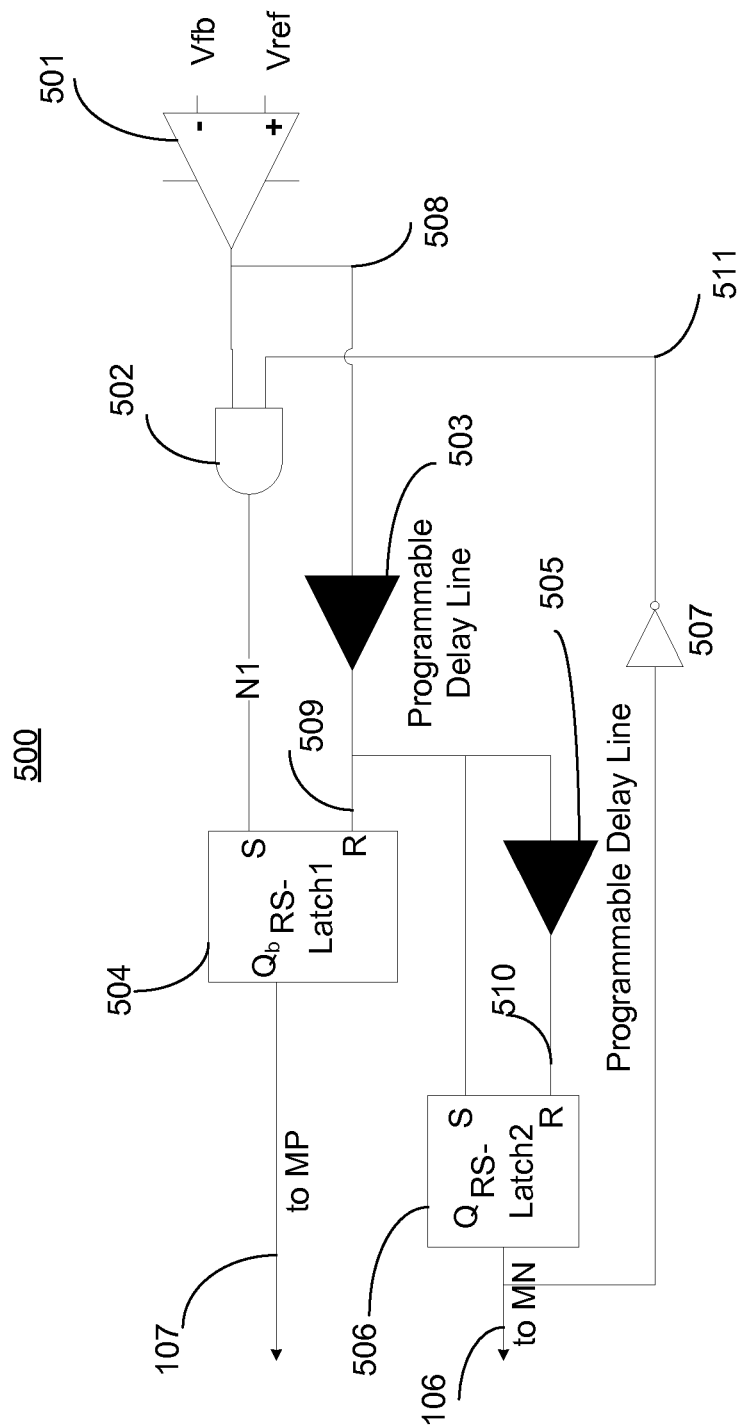
FIG. 5 is the controller operating in PFM mode using the PDL, according to one embodiment of the disclosure.

FIG. 5 is a low power controller 500 (part of 104) operating in PFM mode using the PDL, according to one embodiment of the disclosure. It is pointed out that those elements of FIG. 5 having the same reference numbers (or names) as the elements of any other figure can operate or function in any manner similar to that described, but are not limited to such.

In one embodiment, low power controller 500 (part of 104) comprises comparator 501, logic unit 502, first PDL 503, first latch 504, second PDL 505, second latch 506, and inverter 507. In one embodiment, comparator 501 compares Vfb (same as Vout of FIG. 1) with a reference voltage Vref (e.g., 1.0V). In one embodiment, output 508 of comparator 501 is received by first PDL 503. In one embodiment, once PDL 400 is programmed, its code can be used to generate ON time for PFM controller 500.

While PDL 204 of pulse recorder 200 is a master circuit, in one embodiment, the same exact PDL circuit is used as PDLs 503 and 504 in PFM controller 500 as slave circuits to give the same delay and thus same ON-times. In one embodiment, PDL 503 is programmed (via its Coarse and Fine signals) with a delay that represents ON time for high-side switch $MP_1$. In such an embodiment, the delay of PDL 503 is set using the delay setting of PDL 204 obtained from pulse recorder 200. In one embodiment, PDL 503 is programmed (via its Coarse and Fine signals) with a delay that represents ON time for low-side switch $MN_1$. In such an embodiment, the delay of PDL 504 is set using the delay setting of PDL 204 obtained from pulse recorder 200.

In one embodiment, comparator 501 detects whether feedback voltage Vfb (same as Vout of FIG. 1) is below reference voltage Vref. In such an embodiment, comparator 501 output 508 changes its state from logical low to logical high. In one embodiment, first and second latches 504 and 506 are reset-set (RS) latches. In one embodiment, first RS-latch (Latch1) 504 generates a pulse 107 for high-side switch $MP_1$ with ON time Top. In one embodiment, second RS-latch (Latch2) 506 generates a pulse 106 for low-side switch $MN_1$ with ON-time $T_{ON}$. In one embodiment, the signal 106 that goes to low-side switch $MN_1$ is fed back into a logic gate 502 (e.g., AND gate, or NAND gate) to reset the comparator output 508 for duration of $T_{ON}$. The circuit of 500 regenerates PFM pulses and ensures the continuation of ON time pulses when output voltage decreases below Vref, according to one embodiment.

Figure 6:
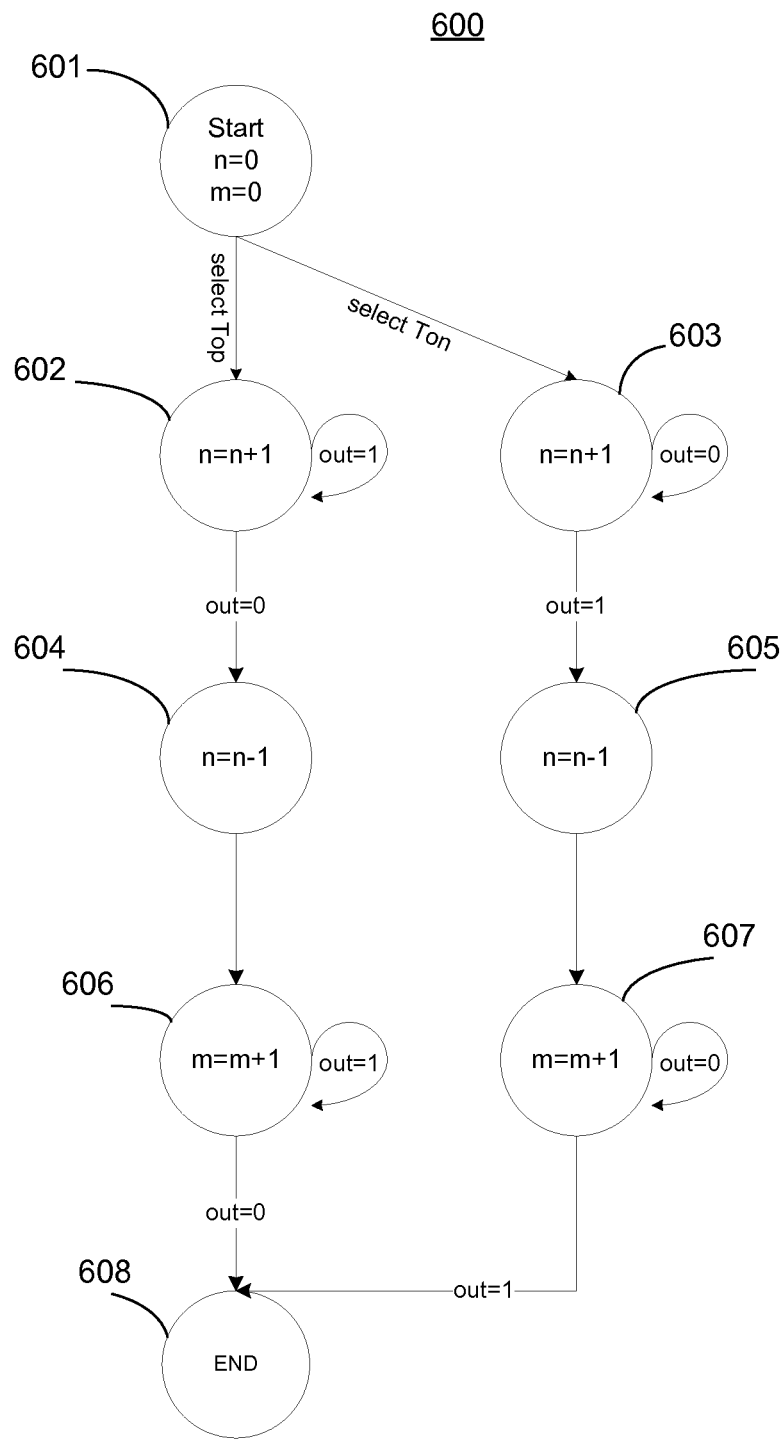
FIG. 6 is state diagram of a Finite State Machine (FSM) of the PWM pulse width recorder, according to one embodiment of the disclosure.

FIG. 6 is state diagram 600 of an FSM (e.g., FSM 203) of PWM pulse width recorder 200, according to one embodiment of the disclosure. It is pointed out that those elements of FIG. 6 having the same reference numbers (or names) as the elements of any other figure can operate or function in any manner similar to that described, but are not limited to such.

In one embodiment, state diagram 600 of FSM (e.g., FSM 203) comprises eight states. However, state diagram 600 may have fewer or more than eight states. In this state diagram, 'n' corresponds to a Coarse counter (not shown) that adjusts Coarse<n:0> signal, while 'm' corresponds to a Fine counter (not shown) that adjusts Fine<m:0> signal.

At state 601, FSM 203 starts by initializing 'n' and 'm' i.e., n=0 and m=0. In such an embodiment, Coarse and Fine counters are initialized to begin counting from zero. If selection unit 201 is set to select $T_{OP}$ (i.e., ON-time measurement of high-side switch $MP_1$), then state diagram 600 proceeds to state 602. At state 602, 'n' is incremented by 1 as long as "out" is logical high i.e., Coarse counter count is incremented. When "out" transitions from logical high to logical low, FSM 203 state transitions from state 602 to state 604. At state 604, 'n' is decremented by one clock cycle (logic-ck) i.e., Coarse counter count is decremented by just 1 clock cycle then FSM 203 state transitions to state 606.

At state 606, 'm' begins to increment by one every clock cycle (logic-ck) as long as "out" is logical high i.e., Fine counter count is incremented. When "out" becomes logical low, then the ON time for $MP_1$ (high-side switch) is determined and at state 608 the delay settings for ON time for $MP_1$ are stored in a register. In one embodiment, the register is same as the Top register. In one embodiment, the delay settings for ON time for $MP_1$ are then used to program PDL 503.

If selection unit 201 is set to select $T_{ON}$ (i.e., ON-time measurement of low-side switch $MN_1$), then state diagram proceeds to state 603. In state 603, 'n' (which is initially zero) is incremented by one every clock cycle (logic-ck) until output "out" remains logical zero i.e., Coarse counter is incremented. In one embodiment, when "out" transitions from logical low to logical high, FSM 203 transitions to state 605. In state 605, 'n' is decremented by one clock cycle (logic-ck) and then FSM 203 transitions to state 607.

In state 607, 'm' (which is initially zero) increments by one in every clock cycle (logic-ck) as long as "out" remains logical zero i.e., Fine counter is incremented. When "out" transitions from logical low to logical high, then the ON-time for $MN_1$ (low-side switch) is determined and at state 608 the delay settings for ON-time for $MN_1$ are stored in a register. In one embodiment, the delay settings for ON-time for $MN_1$ are then used to program PDL 505.

Figure 7A:
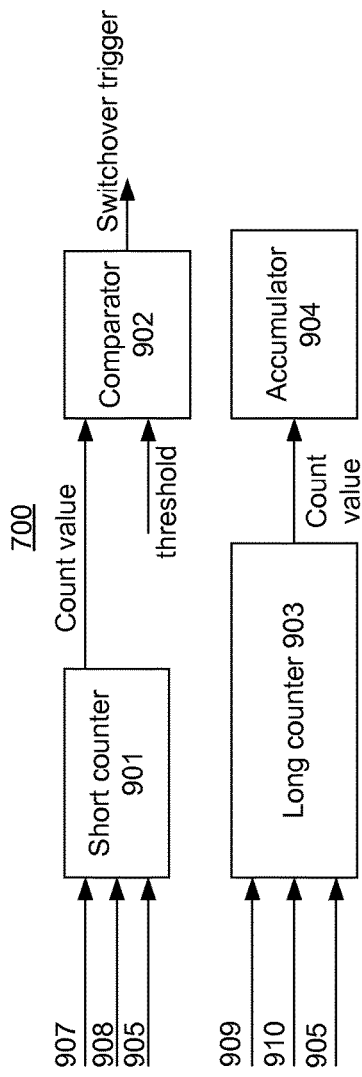
FIGS. 7A-B illustrate a digital current sensor and its operation, according to one embodiment of the disclosure.
Figure 7B:
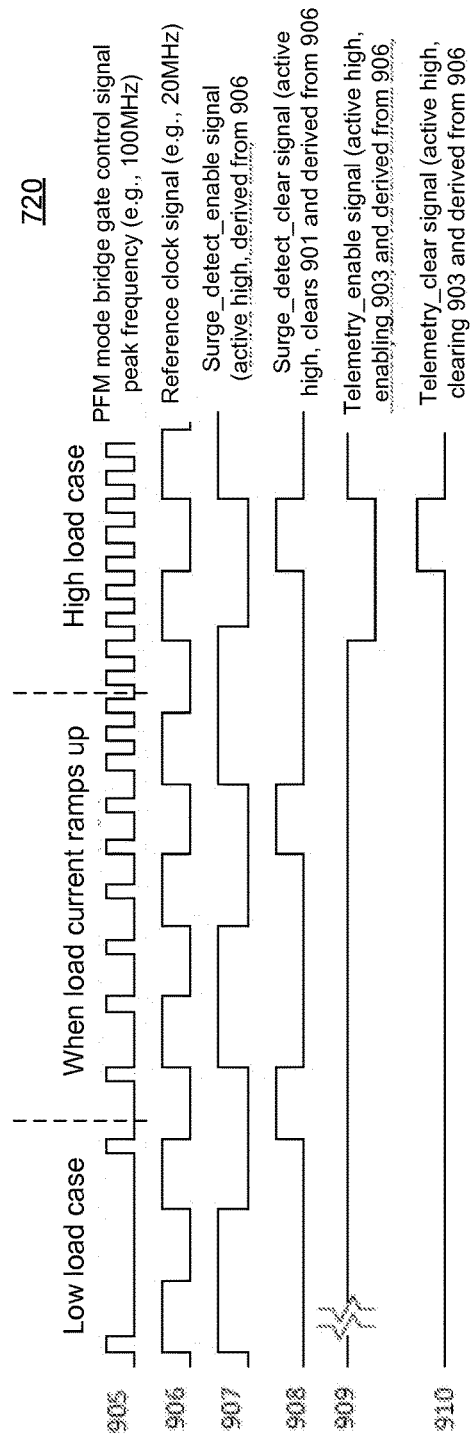

FIGS. 7A-B illustrate a digital current sensor 700 and its operation (waveforms 720), according to one embodiment of the disclosure. It is pointed out that those elements of FIGS. 7A-B having the same reference numbers (or names) as the elements of any other figure can operate or function in any manner similar to that described, but are not limited to such.

FIG. 7A is a high level architecture 700 for current sensing with digital means. In one embodiment, architecture 700 comprises a short counter 901, comparator 902, long counter 903, and accumulator 904. In one embodiment, short counter 901 is a 4-bit counter to provide surge detection function. For example, short counter 901 is used to detect load current surge over a short period e.g., 50 ns. In one embodiment, short counter 901 receives enable signal 907 (see, FIG. 7B) which is derived from reference clock signal 906, e.g., 20 MHz.

In one embodiment, any high count of PFM mode bridge control signal 905 over a short duration indicates load current surge. In one embodiment, bridge control signal 905's instantaneous frequency scales with load current amplitude. For example, bridge control signal 905 has low frequency under low load situation, and its frequency begins to ramp up when load current ramps up. In one embodiment, when short counter 901 completes counting, the short term frequency value (output of short counter 901) is compared with a preset threshold value by comparator 902. In one embodiment, the preset threshold value is programmable. In one embodiment, when count of short counter 901 exceeds the preset threshold value, a signal is triggered to signal VR 100 to transition to PWM mode from PFM mode. In one embodiment, short counter 901 is used to enable fast detection of current surge and PWM mode transition.

In this example, reference clock signal 906 is 20 MHz and surge detect enable signal 907 is set as one cycle of 20 MHz clock. If short counter 901 has a value of four, it indicates that when PFM bridge control signal 905 reaches 80 MHz, load current approaches high end. In one embodiment, when VR 100 operates in low load condition, output value of the short counter 901 can be as low as zero. For the described embodiment, the PWM transition (i.e., transition from PFM mode to PWM mode) can be triggered within 100 ns upon detection of current surge.

In one embodiment, long counter 903 is used to realize load current telemetry function. For example, 16-bit counter is used for accumulating PFM mode bridge switching over a long period (e.g., 100 μs with 11-bit timer of 20 MHz of reference clock signal). In one embodiment, long counter 903 accumulates pulses of PFM mode bridge control signal 905 over much longer duration than surge detector counter 901 (i.e., short counter). In such an embodiment, a more averaged current load profile is determined over that duration. In one embodiment, the counted value is sent to power management unit/micro-controller for further processing. For example, power management unit/micro-controller uses the counted value to process power usage and optimize (i.e., achieve higher VR efficiency) VR performance.

In one embodiment, telemetry enable signal 908 and telemetry clear signal 910 show clear signals, respectively for short counter 901 and long counter 903 to reset the counters for next measurement cycle. Since counting durations of short counter 901 and long counter 903 are derived from the same reference clock signal 906, values of short counter 901 and long counter 903 reflect instantaneous and average frequency of PFM mode bridge control signal 905. In one embodiment, accumulator 904 accumulates output from long counter 903 and takes an average of the output from long counter 903. With the embodiments described, instantaneous and average load current can be accurately measured.

Figure 8:
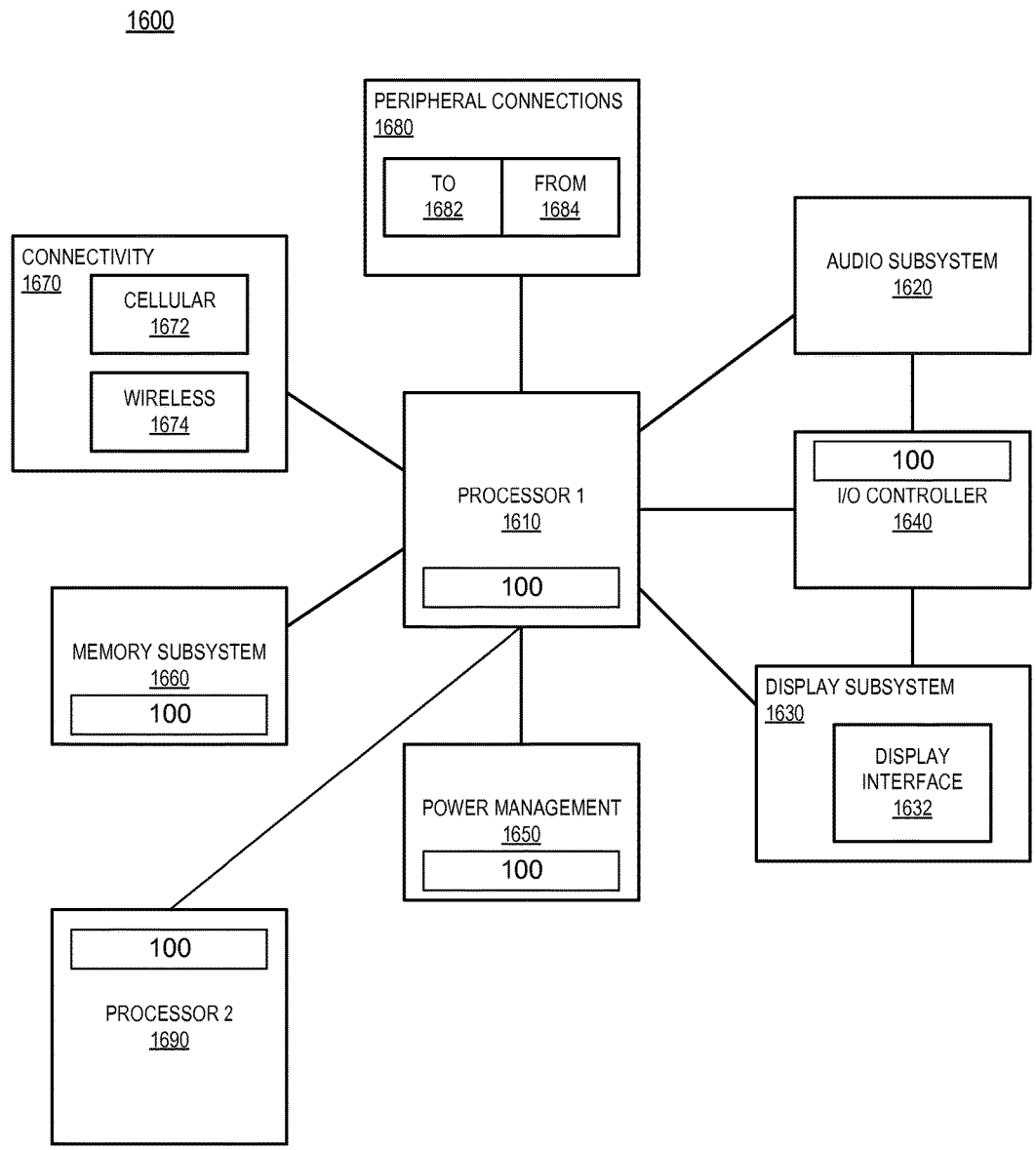
FIG. 8 is a smart device or a computer system or an SoC (system-on-chip) with VR of FIG. 1, according to one embodiment of the disclosure.

FIG. 8 is a smart device or a computer system or a SoC (system-on-chip) with VR of FIG. 1, according to one embodiment of the disclosure. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with VR 100, according to the embodiments discussed. Other blocks of the computing device 1600 may also include VR 100. The various embodiments of the present disclosure may also comprise a network interface within 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device 1600. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or some "embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus comprises: a PDL to receive a PWM signal as input and to generate a first output; a selection unit operable to provide PWM signal or its inverted version as a second output; and a sequential unit coupled to the PDL, the sequential unit to sample the second output with the first output, the sequential unit to generate a PFM output. In one embodiment, the apparatus further comprises a FSM coupled to the PDL and the sequential unit.

In one embodiment, the FSM is operable to adjust delay of the first output relative to the PWM signal. In one embodiment, the FSM is operable to generate a third output for controlling turn-on time of a high-side switch of a voltage regulator (VR). In one embodiment, the FSM is operable to generate a fourth output for controlling turn-on time of a low-side switch of the VR. In one embodiment, the PDL comprises: a chain of delay cells coupled together in series with one another; a multiplexer to select outputs of the delay cells; and a current starved inverter, coupled to the multiplexer. In one embodiment, the multiplexer is controllable by the FSM.

In another example, a VR comprises: mutually coupled on-die inductors for coupling to a load; a bridge, coupled to the mutually coupled on-die inductors, including a low-side switch and a high-side switch; a PWM controller for controlling the low-side and high-side switches during a first load current; and a PFM controller for controlling the low-side and high-side switches during a second load current, the second load current being smaller than the first load current, wherein the PFM controller comprises: a comparator for comparing output voltage of the load with a reference voltage; and a first PDL coupled to the comparator for determining turn-on duration of the high-side switch.

In one embodiment, the PFM controller further comprises: a first latch to receive output of the first PDL and to generate an output for controlling the turn-on duration of the high-side switch. In one embodiment, the PFM controller further comprises: a second PDL coupled to the first PDL, the second PDL for determining turn-on duration of the low-side switch. In one embodiment, the second PDL is pre-programmed with a delay which corresponds to a duty cycle portion of a PWM signal. In one embodiment, the PFM controller further comprises: a second latch to receive output of the second PDL and to generate an output for controlling the turn-on duration of the low-side switch.

In one embodiment, the PFM controller further comprises: a logic gate to perform AND operation on outputs of the comparator and output or an inverted output of the second latch, the output of the logic gate to further control the turn-on duration of the high-side switch. In one embodiment, the first PDL is pre-programmed with a delay which corresponds to a duty cycle portion of a pulse-width modulated (PWM) signal. In one embodiment, the VR further comprises a digital current sensor. In one embodiment, the digital current sensor comprises: a first counter to detect current surge flowing through an output of the load, the first counter to count pulses generated by the PFM controller. In one embodiment, the digital current sensor comprises: a second counter to detect normal current flowing through the output of the load, the second counter to count pulses generated by the PFM controller, wherein the second counter to count pulses using a clock signal having a frequency slower than a clock signal used by the first counter.

In another example, a system comprises: a memory (e.g., DRAM, SRAM, Phase Change Memory (PCM), Magnetic RAM, etc); a processor coupled to the memory, the processor including a voltage regulator as described in the embodiments; and a wireless interface for allowing the processor to communicate with other devices. In one embodiment, the system further comprises a display unit to display data processed by the processor. In one embodiment, the display unit is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a programmable delay line (PDL) to receive a pulse-width modulated (PWM) signal as an input and to generate a first output signal having a delay relative to the PWM signal;
    a selection unit operable to provide one of the PWM signal and an inverted version of the PWM signal as a second output signal; and
    a sequential unit having a first input coupled to an output of the PDL to receive the first output signal, the sequential unit having a second input coupled to an operable to sample the second output signal with the first output signal, sequential unit to generate an output signal to provide a pulse duration for a pulse-frequency modulated (PFM) signal according to the PWM signal, wherein the PDL is operable to adjust the delay based on a pulse duration of the PWM signal.

2. The apparatus of claim 1, further comprising a finite state machine (FSM) having an input coupled to an output of the sequential unit, the FSM having an output coupled to the PDL.

3. The apparatus of claim 2, wherein the FSM is operable to adjust the delay of the first output signal relative to the PWM signal.

4. The apparatus of claim 2, wherein the FSM is operable to generate a third output signal for controlling a turn-on time of a high-side switch of a voltage regulator (VR).

5. The apparatus of claim 4, wherein the FSM is operable to generate a fourth output signal for controlling a turn-on time of a low-side switch of the VR.

6. The apparatus of claim 2, wherein the PDL comprises:
    a chain of delay cells coupled together in series with one another;
    a multiplexer to select outputs of the delay cells; and
    a current starved inverter, coupled to the multiplexer.

7. The apparatus of claim 6, wherein multiplexer is controllable by the FSM.

* * * * *